United States Patent

McHugh et al.

[11] Patent Number: 5,984,693
[45] Date of Patent: Nov. 16, 1999

[54] CONTACT OF AN LGA SOCKET

[75] Inventors: Robert G. McHugh, Evergreen, Colo.; Nick Lin, Taipei Hsien, Taiwan

[73] Assignee: Hon Hai Precision Ind. Co., Ltd., Taipei Hsien, Taiwan

[21] Appl. No.: 09/215,514

[22] Filed: Dec. 17, 1998

[51] Int. Cl.⁶ .................................................. H01R 9/09
[52] U.S. Cl. ................................................ 439/66; 439/515
[58] Field of Search ............................... 439/66, 71, 81, 439/91, 515, 733.1, 591

[56] References Cited

U.S. PATENT DOCUMENTS

| | | | |
|---|---|---|---|
| 5,064,391 | 11/1991 | Butcher | 439/733.1 |
| 5,213,513 | 5/1993 | Brown et al. | 439/68 |
| 5,230,632 | 7/1993 | Baumberger et al. | 439/66 |
| 5,395,252 | 3/1995 | White | 439/66 |
| 5,653,598 | 8/1997 | Grabbe | 439/66 |
| 5,655,913 | 8/1997 | Castaneda et al. | 439/66 |
| 5,762,505 | 6/1998 | Lin | 439/83 |
| 5,841,640 | 11/1998 | Shibata | 361/820 |

*Primary Examiner*—Khiem Nguyen
*Assistant Examiner*—Michael C. Zanoli

[57] ABSTRACT

A contact of an LGA socket comprises a main plate having two guiding and positioning extensions projecting upward from two ends of a beveled upper edge thereof, two lower engagement pins extending downward from two ends of a lower edge of the main plate, and at least one barb formed on each of two opposite vertical sides of the main plate. A resilient C-shaped upper engagement pin curvedly extends upward from a middle portion of the lower edge of the main plate and includes a contacting tip extending upright from one end of the upper engagement pin substantially beyond a horizontal level of the two guiding and positioning extensions.

5 Claims, 4 Drawing Sheets

US 5,984,693

CONTACT OF AN LGA SOCKET

BACKGROUND OF THE INVENTION

1. Field of The Invention

The present invention relates to a contact for an LGA socket, and especially to a contact having a simple and reliable structure for use in an LGA socket.

2. The Prior Art

Land grid array (LGA) sockets are commonly used with IC packages and do not require soldering procedures during engagement between the LGA socket and a related mother board. Normally, an LGA assembly includes an IC package having a plurality of flat contact pads formed on a bottom surface thereof, a socket having an insulative housing and defining a plurality of passageways therethrough, and a plurality of conductive contacts received in the passageways of the socket. Fastening means consisting of a top plate positioned on a top surface of the IC package, a bottom plate positioned on a bottom surface of the PCB, and a plurality of sets of aligned holes defined through the PCB, the top plate and the bottom plate is used to configure the assembly. Each set of aligned holes receives a screw therein which engages with a washer and a nut thereby sandwiching the LGA assembly between the top and bottom plates.

U.S. Pat. No. 5,653,598 discloses an electrical contact for use in a connector 30 between mutually opposed electrical interfaces 40, 8 such as contact pads respectively formed on an IC package 2 and a printed circuit board 6, as seen in FIG. 5. The conventional contact comprises a generally planar contact body 10 having first and second major faces 110, 120. The body includes a pair of spaced apart spring arms 140, 150 connected by a resilient bight portion 160. The spring arms 140, 150 each have a free end with an outwardly facing edge forming a contact nose 17, 18 for engaging with the corresponding interface 40, 8. Shorting sections 19, 20 generally extend toward each other from the free ends and are offset such that, upon deflection of the spring arms 140, 150 toward each other, the shorting sections 19, 20 overlap and the first major face 110 engages the second major face 120. Thus, a shortened electrical path is formed between the contact noses 17, 18 when the package 2 is urged against the connector 30.

However, the shorting sections 19, 20 may not properly contact each other due to unwanted lateral deflection thereof when the bight of the contact is deformed. Although the inner wall of the passageway receiving the contact may be used to limit the lateral deflection of the shorting sections 19, 20, unwanted scraping of the shorting sections 19, 20 against the inner wall of the passageway may occur thereby adversely affecting the proper overlap of the two shorting sections 19, 20. Proper overlap and engagement of the two shorting sections 19, 20 is difficult to achieve with this structure. Therefore, it is requisite to provide a new structure of the contact by which a shortened connection path may result upon urging the IC package against the connector.

SUMMARY OF THE INVENTION

The primary purpose of the present invention is to provide a contact of an LGA socket, having a good alignment and guiding effect when the contact is urged resulting in a short transmission path between an IC package and a printed circuit board.

The second purpose of the present invention is to provide a contact of an LGA socket, having a relatively simple structure for providing an excellent positioning effect.

To fulfill the above purposes, a contact of an LGA socket comprises a main plate having two guiding and positioning extensions projecting upward from two ends of a beveled upper edge thereof, two lower engagement pins extending downward from two ends of a lower edge of the main plate, and at least one barb formed on each of two vertical sides of the main plate, and a resilient C-shaped upper engagement pin curvedly extending upward from a middle portion of the lower edge of the main plate and including a contacting tip extending upright from one end of the C-shaped structure substantially beyond a horizontal level of the two guiding and positioning extensions. The contacting tip is separated a predetermined distance from the beveled upper edge and the C-shaped structure lies in a vertical plane between the two extensions.

DETAILED DESCRIPTION OF THE PREFERRED EMBODIMENT

Figure 1:
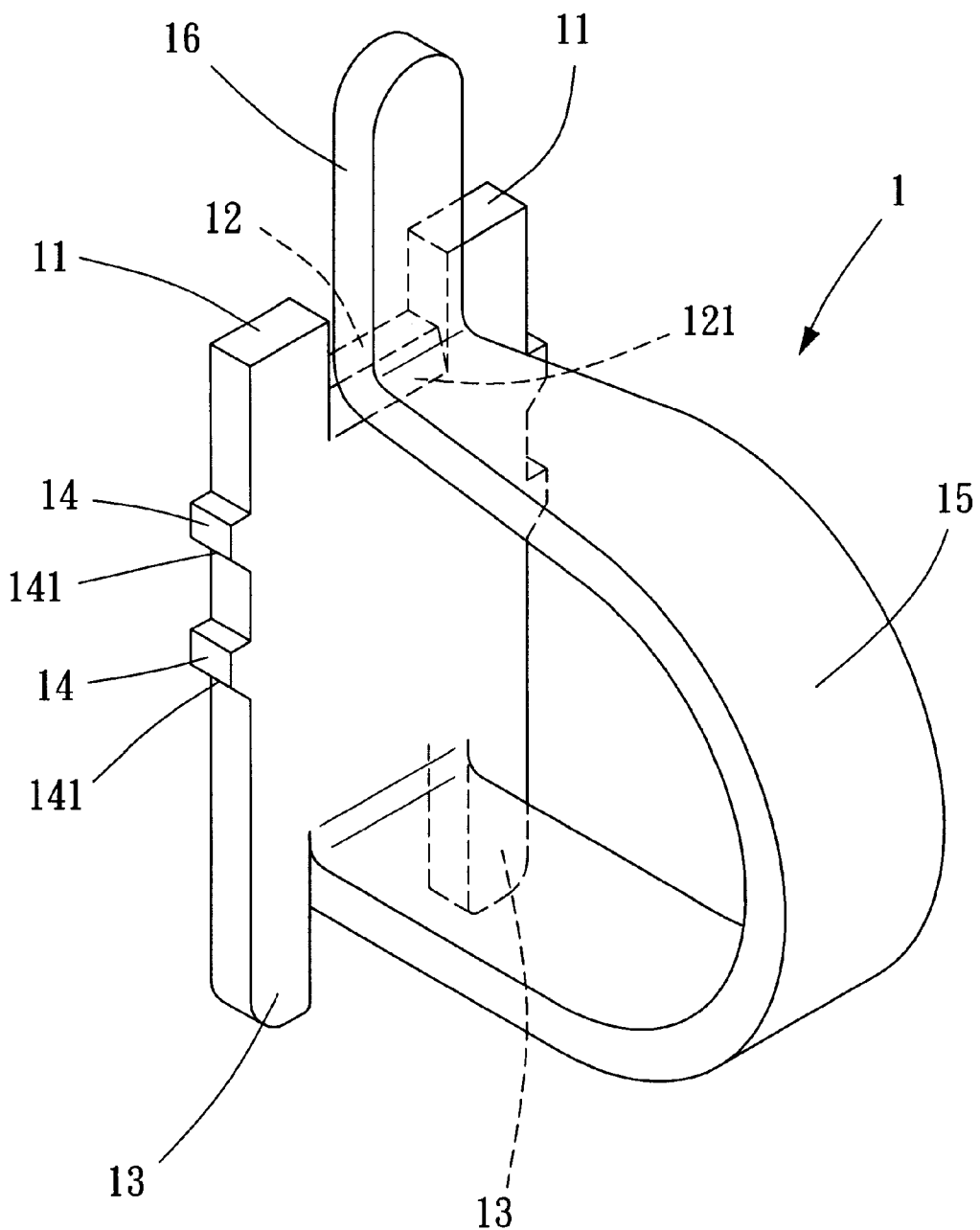
FIG. 1 is a perspective view of a contact of an LGA socket in accordance with the present invention.

Referring to FIG. 1, a contact of an LGA socket comprises a main plate 1 having two guiding and positioning extensions 11 projecting upward from two ends of a beveled upper edge 12 thereof, two lower engagement pins 13 extending downward from two ends of a lower edge of the main plate 1, and two barbs 14 formed on each of two opposite sides of the main plate 1 with a lower tapering portion 141 on each barb 14. A resilient C-shaped upper engagement pin 15 curvedly extends upward from a middle portion of the lower edge of the main plate 1 and includes a contacting tip 16 extending upright from one end of the upper engagement pin 15. The contacting tip 16 is spaced from the beveled upper edge 12 a predetermined distance whereby the contacting tip 16 will contact the beveled upper edge 12 upon receipt of an external downward force. The beveled upper edge 12 forms a tapered surface 121 between the two extensions 11 for facilitating stable contact with the contacting tip 16 when the contacting tip 16 receives a vertical urging force. The main plate 1 has a width substantially equaling a total width of the resilient C-shaped upper engagement pin 15 and the two lower engagement pins 13.

Figure 2:
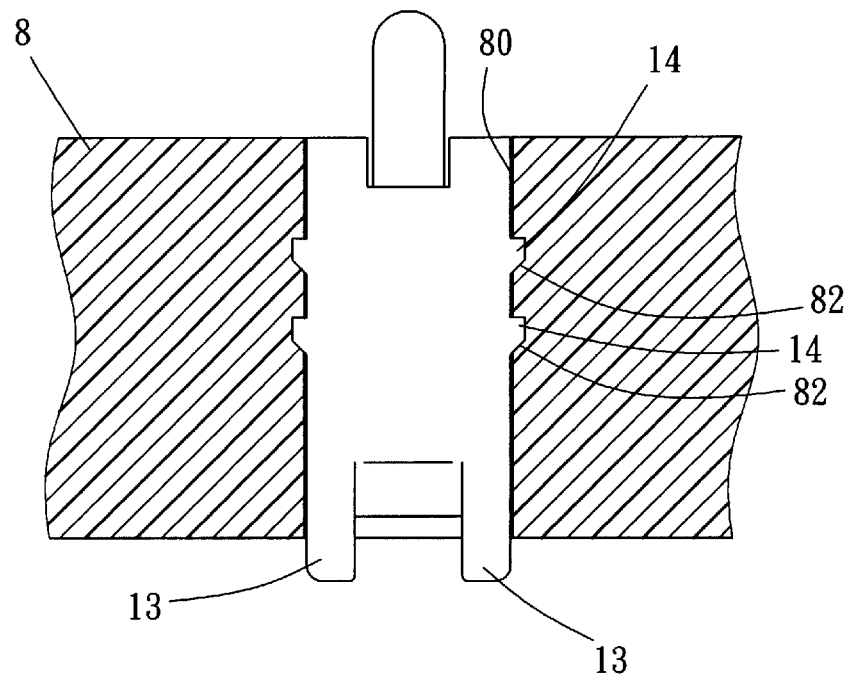
FIG. 2 is a front view of the contact installed in an LGA socket.

Referring to FIG. 2, the contact is received in a passageway 80 of a housing 8 of an LGA socket from a downward direction by interferentially engaging the barbs 14 with recesses 82 defined in inner walls of the passageway 80. The contact is firmly engaged within the passageway 80 due to the four engagement points formed in the two inner walls thereof.

Figure 3:
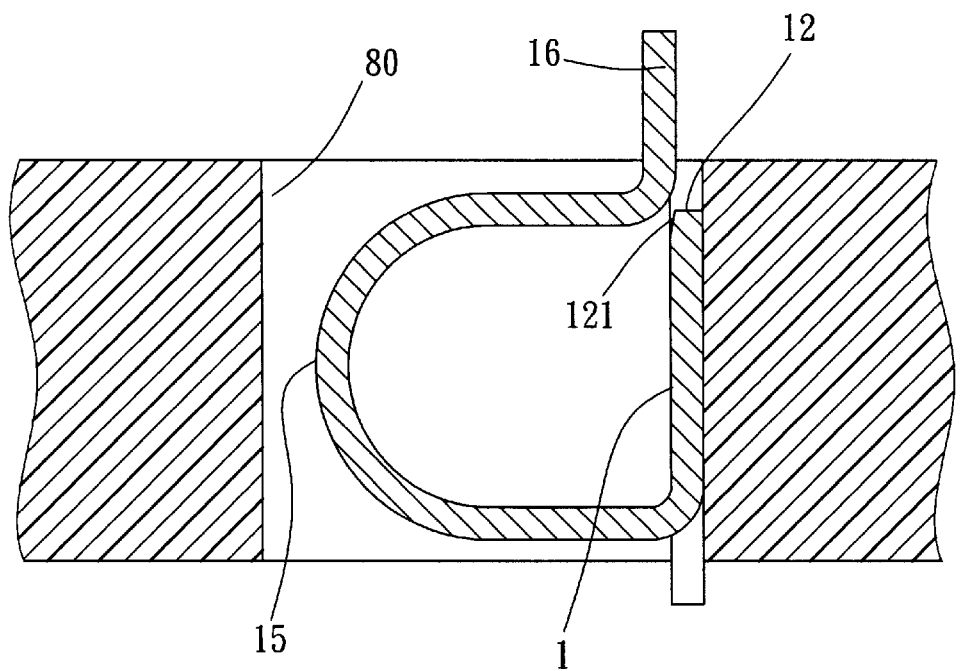
FIG. 3 is a side view of the contact installed in an LGA socket.

The contact shown in FIG. 3 is fixed within the passageway 80 with the tip 16 separated a predetermined distance from the beveled upper edge 12.

Figure 4:
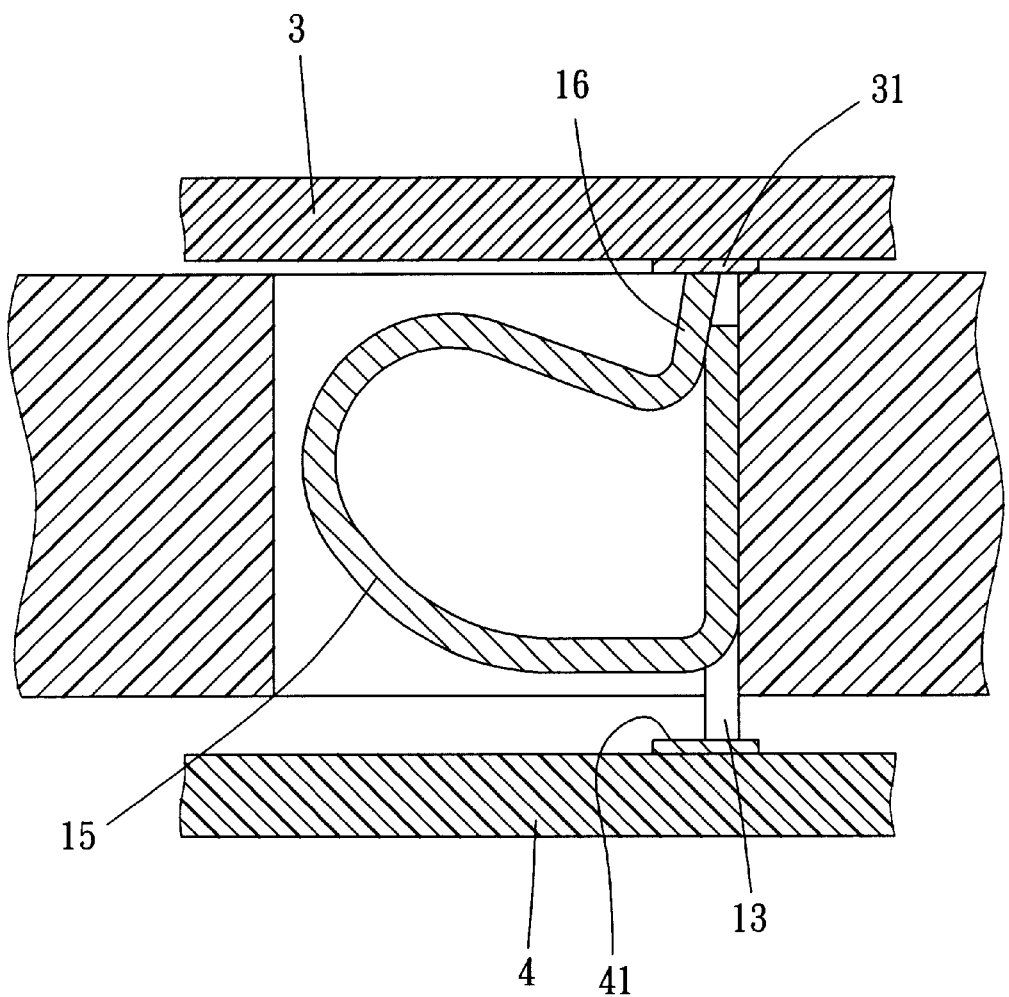
FIG. 4 is a side view of the contact installed in an LGA socket and sandwiched between a CPU chip and a motherboard.

Referring to FIG. 4, the LGA socket of FIG. 3 is sandwiched between an LGA-type CPU chip 3 and a mother board 4. The CPU chip 3 has a pad 31 forcibly urging the tip 16 of the contact, and the lower engagement pins 13 each abut against a pad 41 of the mother board 4. The resilient pin 15 is deformed and the tip 16 electrically contacts the main plate 1 with a portion thereof being limited between the guiding and positioning extensions 11. The main plate 1 has a width much greater than that of the resilient pin 15 and a shorter conductive path than that of the resilient pin 15; therefore, the conductivity of the urged shape of the contact is better than that of the unurged one.

Figure 5:
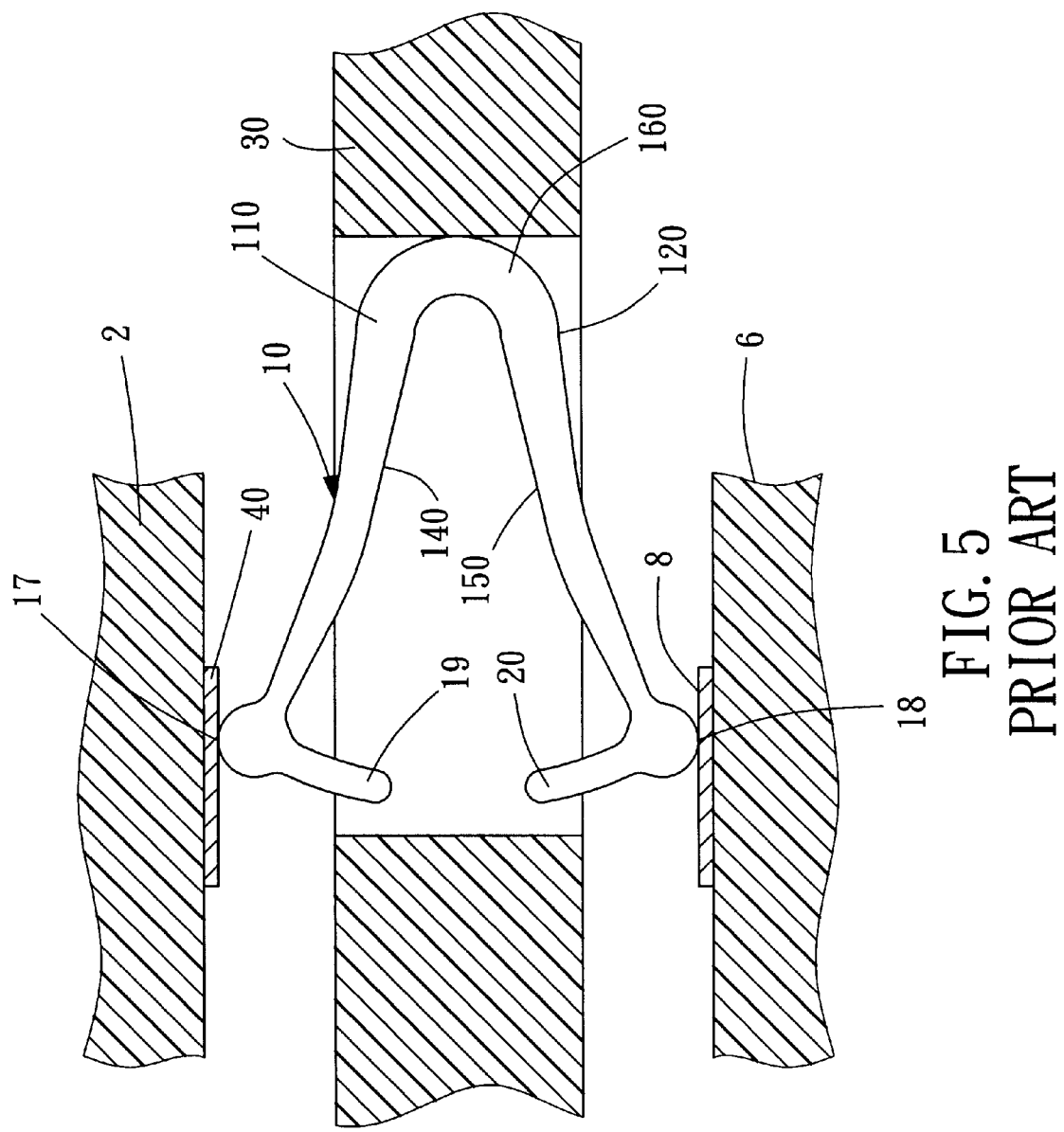
FIG. 5 is a side view of a conventional contact received in an LGA connector and sandwiched between an IC package and a printed circuit board.

The embodiment of the present invention has three points superior to the conventional LGA pins of FIG. 5. Firstly, the structure of the guiding and positioning extension 11 guarantees that the tip 16 is in continuous contact with the beveled edge 12 without deflection when the pin 16 is depressed. Secondly, the four barbs 14 formed along the opposite sides of the main plate 1 are simple structures which provide proper engagement capabilities. Thirdly, the contact has two lower engagement pins 13 for increasing the contact area between the contact and the mother board 4.

While the present invention has been described with reference to a specific embodiment, the description is illustrative of the invention and is not to be construed as limiting the invention.

Therefore, various modifications to the present invention can be made to the preferred embodiment by those skilled in the art without departing from the true spirit and scope of the invention as defined by the appended claims.

What is claimed is:

1. A contact of an LGA socket comprising a main plate having two guiding and positioning extensions projecting upward from two ends of a beveled upper edge thereof, two lower engagement pins extending downward from two ends of a lower edge of the main plate, and at least one barb formed on each of two vertical sides of the main plate, and a resilient C-shaped upper engagement pin curvedly extending upward from a middle portion of the lower edge of the main plate and including a contacting tip extending upright from one end of the upper engagement pin substantially beyond a horizontal level of the two guiding and positioning extensions, wherein the contacting tip is separated a predetermined distance from the beveled upper edge and the C-shaped structure lies in a vertical plane between the two extensions.

2. The contact as claimed in claim 1, wherein each barb has a lower tapered portion for facilitating insertion of the contact into a corresponding passageway defined in the LGA socket.

3. The contact as claimed in claim 1, wherein the beveled upper edge has a tapered surface between the two extensions.

4. The contact as claimed in claim 1, wherein the main plate has a width substantially equaling a total width of the resilient C-shaped upper engagement pin and the two lower engagement pins.

5. A contact for use with an LGA socket, comprising:

a main plate adapted to abut against a wall of the socket;

at least one lower engagement pin downward extending from a lower portion of the main plate;

a resilient curved upper engagement pin extending upward curvedly from proximate the lower portion of the main plate, and including an upright extending contacting tip; and means for aligning vertically downward movement of the contacting tip of the resilient curve upper engagement pin with regard to the main plate when the contacting tip is depressed downward by a corresponding pad of an LGA package; wherein said means is positioned about an upper portion of the main plate, and said aligning means includes a pair of guiding and positioning extensions projecting upward from two ends of a beveled upper edge of the main plate, whereby the contacting tip can be upward and downward movably positioned between said two extensions for engagement with said beveled upper edge.

* * * * *